(12) United States Patent
Mavencamp

(10) Patent No.: US 6,175,277 B1
(45) Date of Patent: Jan. 16, 2001

(54) BIAS NETWORK FOR CMOS POWER DEVICES

(75) Inventor: Daniel Mavencamp, Brandon, MS (US)

(73) Assignee: Texas Instruments Incorporated, Dallas, TX (US)

(*) Notice: Under 35 U.S.C. 154(b), the term of this patent shall be extended for 0 days.

(21) Appl. No.: 09/246,768

(22) Filed: Feb. 8, 1999

Related U.S. Application Data

(60) Provisional application No. 60/076,321, filed on Feb. 27, 1998.

(51) Int. Cl.[7] ............................................. H03F 3/18
(52) U.S. Cl. ................................... 330/264; 330/268
(58) Field of Search ................................ 330/264, 267, 330/268

(56) References Cited

U.S. PATENT DOCUMENTS

| | | | | |
|---|---|---|---|---|
| 4,015,212 | * | 3/1977 | Miyata | 330/264 |
| 4,401,954 | * | 8/1983 | Suzuki | 330/268 |
| 5,475,343 | * | 12/1995 | Bee | 330/267 |
| 5,512,859 | * | 4/1996 | Moraveji | 330/267 |
| 5,736,902 | * | 4/1998 | Graeme | 330/267 |

* cited by examiner

*Primary Examiner*—Benny Lee
*Assistant Examiner*—Khanh Van Nguyen
(74) *Attorney, Agent, or Firm*—Alan K. Stewart; Wade James Brady, III; Frederick J. Telecky, Jr.

(57) ABSTRACT

An improved bias network for reducing cross-over distortion in a device having complementary p-MOS and n-MOS power transistors includes complementary helper transistors coupled to power transistors for discharging currents while the power transistors are biased in sub-threshold regions of operation. The bias network further includes complementary resistors coupled to the power transistors for biasing the power transistors within saturation regions of operation and for biasing the helper transistors within saturation regions of operation, and complementary feedback circuits connected to the power transistors and operating in conjunction with the resistors for biasing the helper transistors within the saturation regions of operation. Preferably, each of the power transistors are biased into the saturation regions by gate voltage swings of no more than 200 millivolts from the sub-threshold region.

6 Claims, 2 Drawing Sheets

BIAS NETWORK FOR CMOS POWER DEVICES

This application claims benefit to U.S. provisional application No. 60/076,321 filed Feb. 27, 1998.

TECHNICAL FIELD OF THE INVENTION

The present invention relates in general to the field of complementary metal oxide semiconductor ("CMOS") devices. More particularly, the present invention relates to an improved bias network for reducing cross-over distortion in Class A/B CMOS power audio amplifiers.

BACKGROUND OF THE INVENTION

Complementary metal oxide semiconductor ("CMOS") devices are commonly used as transistors in a variety of integrated circuits. CMOS devices are especially popular due to their high-speed switching capabilities and extremely low power consumption. These devices are thus ideal for use as driver circuits, buffers, adders, memories and other electronic components requiring high speed and low power consumption. CMOS devices are widely used in computer systems and other consumer electronics including digital watches and calculators.

In addition, CMOS devices are also commonly used in audio equipment such as Class A/B audio amplifiers. Class A/B amplifiers combine the features of Class A amplifiers, which pass current at all time independent of the audio signal to be amplified, and Class B amplifiers, which use one transistor for amplifying the positive cycle of the audio signal and another for amplifying the negative cycle of the audio signal. The problem with Class A/B amplifiers in general is that high cross-over distortion often results at the "zero-volt line" when one transistor stops amplifying and the other begins.

To address the problem of high cross-over distortion, conventional CMOS audio amplifiers utilize specially designed electronic circuits to reduce cross-over distortion. A first conventional design utilizes an output stage having voltage to current translators, or "$g_m$ stages," to bias the p-metal oxide semiconductor ("MOS") and n-MOS devices into "OFF" states. However, because it is not possible to match the $g_m$ stages, a bias current flows through the p-MOS and n-MOS devices. As such, a greater cross-over distortion results through the zero-point thus providing a higher Total Harmonic Distortion ("THD"), which is severe at high frequencies where the gate of the p-MOS and n-MOS devices must quickly transition from zero volts ($V_{gs}$=0) to a threshold voltage ($V_{gs}$=$V_t$), which is typically 0.7 to 1.0 volt. The first conventional circuit therefore utilizes low threshold p-MOS and n-MOS devices to ensure that the p-MOS and n-MOS devices never become depletion devices, i.e., the p-MOS and n-MOS devices are always operated in enhancement mode.

A second conventional circuit utilizes an additional $g_m$ stage that provides an extra bias gain that in effect "hides" the cross-over distortion of the CMOS device. Although this method provides good THD at low frequencies, the amount of loop gain is insufficient at high frequencies and thus the THD is again poor at high frequencies.

And lastly, a third conventional circuit utilizes a $g_m$ "helper" stage to provide an additional bias voltage for small voltage swings around the cross-over point. This solution has problems in that it requires quite a bit of silicon "real estate," with the "helper" stage not having exactly the same gain and frequency response as the main output stage. Accordingly, as described above for the second conventional circuit, a $g_m$ stage must be added in front of the main output stage, i.e., the p-MOS and n-MOS $g_m$ stages, to linearize the gain near the cross-over point. The addition of this $g_m$ stage however again results on poor THD at high frequencies.

Therefore, a principle object of the present invention is to provide a bias network that reduces cross-over distortion in devices having complementary p-MOS and n-MOS power transistors.

Another object of the present invention is to provide a bias network that reduces cross-over distortion and provides improved total harmonic distortion in Class A/B audio amplifiers having complementary p-MOS and n-MOS power transistors.

Still another object of the present invention is to provide a bias network for a CMOS device that minimizes the number of electronic components required in an integrated circuit implementation of the CMOS device.

Further objects, features and advantages of the invention will become apparent from the following detailed description taken in conjunction with the accompanying figures showing illustrative embodiments of the invention.

SUMMARY OF THE INVENTION

The present invention relates to an improved bias network for minimizing cross-over distortion in a device having complementary p-MOS and n-MOS power transistors. In accordance with a preferred embodiment of the present invention, the improved bias network includes complementary helper transistors coupled to the power transistors for discharging currents while the power transistors are biased in sub-threshold regions of operation, complementary resistors coupled to the power transistors for biasing the power transistors within the sub-threshold regions and for biasing the helper transistors in saturation regions of operation, and complementary feedback circuits connected to the power transistors and operating in conjunction with the resistors for biasing the helper transistors within the saturation regions. Preferably, the improved bias network operates each of the power transistors just below their threshold voltages such that they may be biased into an on-state by a gate voltage swing of no more than 200 millivolts.

Advantageously, the improved bias network of the present invention is used to reduce cross-over distortion in Class A/B audio amplifiers having complementary p-MOS and n-MOS power transistors.

BRIEF DESCRIPTION OF THE DRAWINGS

For a complete understanding of the present invention and the advantages thereof, reference is now made to the following description taken in conjunction with the accompanying drawings in which like reference numbers indicate like features and wherein.

DETAILED DESCRIPTION OF THE INVENTION

Figure 1:
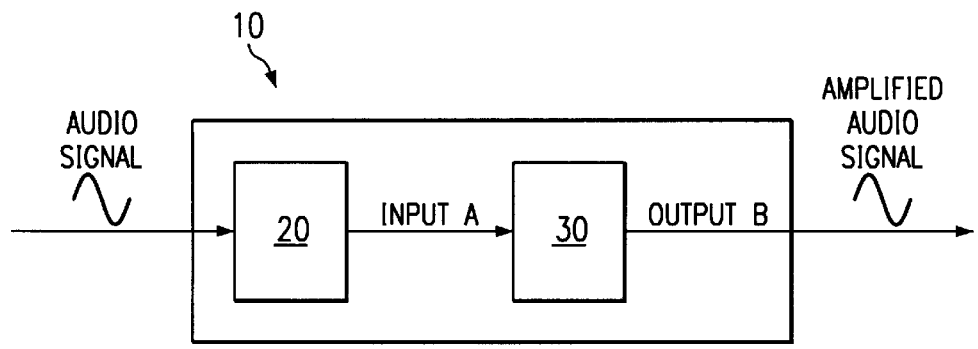
FIG. 1 is a schematic representation of an audio amplifier having an output stage according to a preferred embodiment of the present invention.

FIG. 1 shows a schematic representation of an audio amplifier 10 having an improved bias network according to a preferred embodiment of the present invention. As shown in FIG. 1, the audio amplifier 10 includes an input stage 20 for pre-conditioning and/or pre-amplifying an audio signal, and an output stage 30 for amplifying the output stage input A. The bias network of the present invention is contained within the output stage 30.

Figure 2:
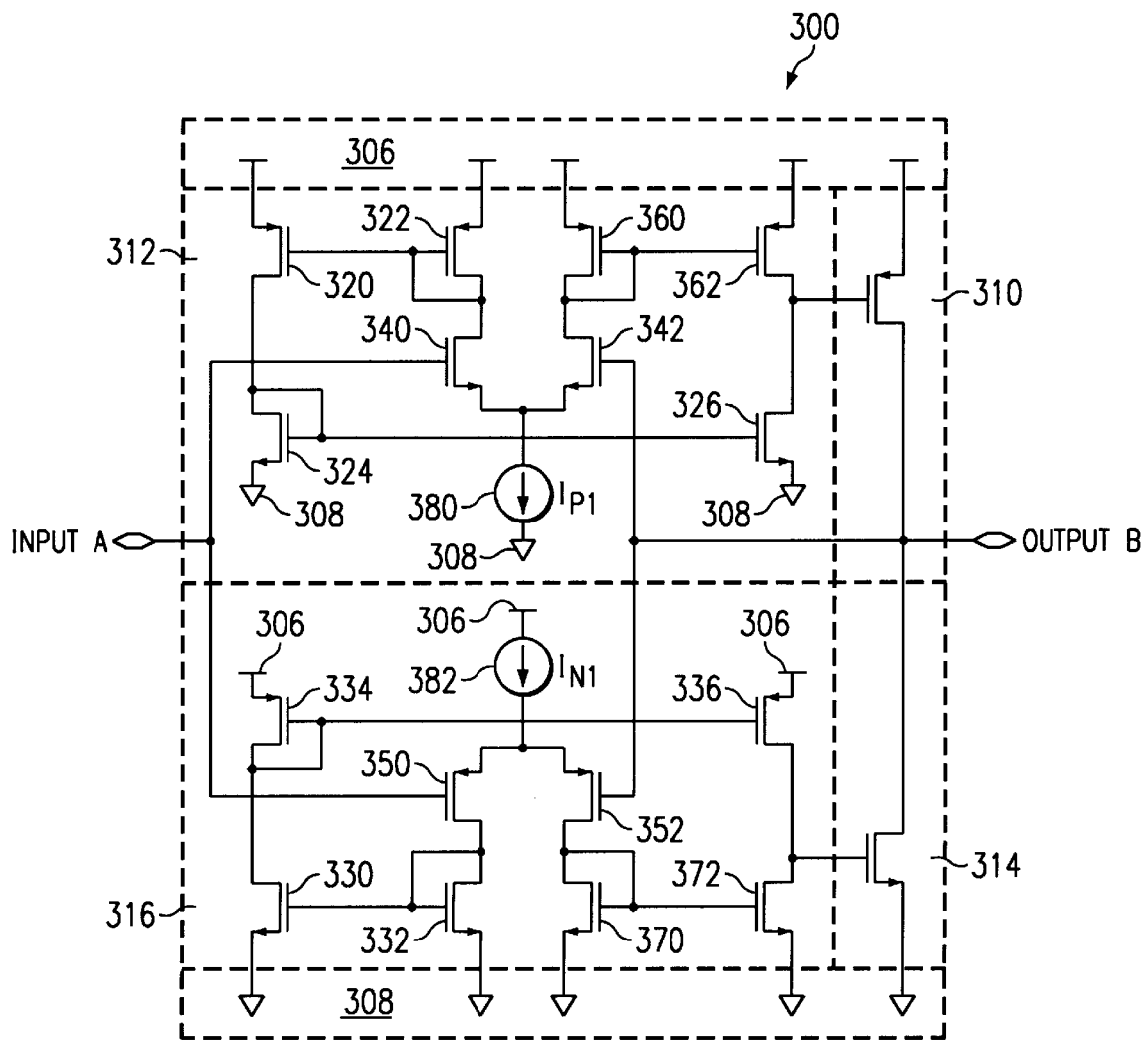
FIG. 2 is a circuit schematic of a conventional output stage for a Class A/B CMOS audio amplifier.
Figure 3:
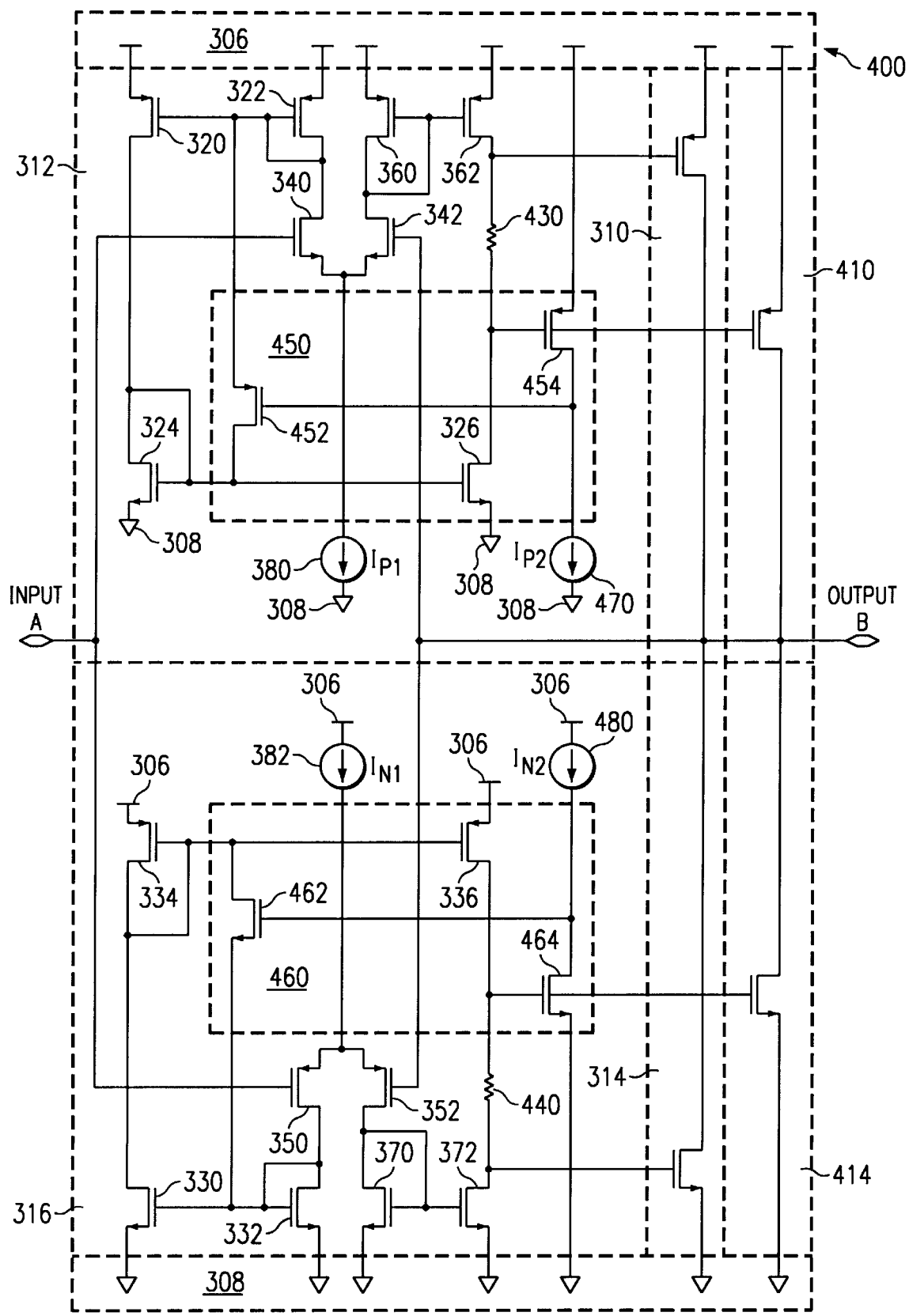
FIG. 3 is a circuit schematic of an output stage for a Class A/B CMOS audio amplifier having an improved bias network according to a preferred embodiment of the present invention.

FIG. 2 shows a circuit schematic of a conventional output stage 300 for an audio amplifier having complementary p-MOS and n-MOS power transistors 310 and 413. FIG. 3 shows the same output stage 300, which also includes a bias network according to a preferred embodiment of the present invention. The conventional output stage 300 is described below in detail in order to more clearly set forth the preferred embodiment of the present invention.

The conventional output stage 300 of FIG. 2 is comprised generally of complementary p-MOS and n-MOS power transistors 310 and 314, corresponding voltage-to-current translators, or "$g_m$ stages," 312 and 314, a positive supply rail 306, and a negative supply rail 308. Preferably, the positive supply rail 306 provides a voltage within the range of 3.0 to 5.0 volts, and the negative supply rail 308 is grounded at 0.0 volts. Preferably, the $g_m$ stages 312 and 316 each include three current mirrors and a differential pair of MOS devices.

The p-MOS and n-MOS power transistors 310 and 314 are relatively "large" transistor devices capable of handling drain currents in the range of 100 mA to several amps, and are used for the primary amplification of the input signal A. As shown, the p-MOS power transistor 310 is used to amplify the positive cycle of the input signal A, and the n-MOS power transistor is used to amplify the negative cycle of the input signal A. The $g_m$ stages 312 and 316 drive the p-MOS and n-MOS power transistors 310 and 314 by switching the appropriate power transistors 310 and 314 on and off.

As further shown in FIG. 2, each of the power transistors 310 and 314 have corresponding first current mirrors for turning on the power transistors 310 and 314. The first current mirror for the p-MOS power transistor 310 includes p-MOS devices 320 and 322 configured as a top current mirror, and n-MOS devices 324 and 326 as a bottom current mirror. The sources of the p-MOS devices 320 and 322 are connected to the positive supply rail 306, with their respective gates connected to each other. The gates of the n-MOS devices 324 and 326 are also connected to each other, with their respective sources connected to the negative supply rail 306. The drains of devices 320 and 324 are connected to each other as shown in FIGS. 2 and 3.

The bottom current mirror n-MOS device 324 corresponding to the p-MOS power transistor 310 is configured such that its gate is connected to its drain. As such, the n-MOS device 324 functions as a diode that receives the current mirrored by the p-MOS devices 320 and 322, where the mirrored current is converted into a voltage by the output impedance of the n-NOS device 326. This voltage is then mirrored and applied to the gate of the p-MOS power transistor 310.

Similarly, the first current mirror for the n-MOS power transistor 314 includes n-MOS devices 330 and 332 configured as a bottom current mirror, and p-MOS devices 334 and 336 as a top current mirror. The sources of the p-MOS devices 334 and 336 are connected to the positive supply rail 306, with their respective gates connected to each other. The gates of the n-MOS devices 330 and 332 are also connected to each other, with their respective sources connected to the negative supply rail 306. The drains of devices 330 and 334 are connected to each other as shown in FIGS. 2 and 3.

The top current mirror p-MOS device 330 corresponding to the n-MOS power transistor 314 is configured such that its gate is connected to its drain. As such, the p-MOS device 334 functions as a diode that receives the current mirrored by the p-MOS devices 330 and 332, where the mirrored current is converted into a voltage by the output impedance of the p-MOS device 336. This voltage is in then mirrored and applied to the gate of the n-MOS power transistor 314.

The $g_m$ stages 312 and 316 also include differential pairs of n-MOS and p-MOS devices for driving the CMOS power transistors 310 and 314. The n-MOS devices 340 and 342 drive the p-MOS power transistor 310 by steering the "tail current" $I_{1P}$, and the p-MOS devices 350 and 352 drive the n-MOS power transistor 314 by steering the "tail current" $I_{N1}$.

In addition, the $g_m$ stages 312 and 316 each include a second current mirror corresponding to the p-MOS and n-MOS power transistors 310 and 314. The second current mirrors primarily function to turn off the power transistors 310 and 314. The p-MOS devices 360 and 362 are used as the second current mirrors for the p-MOS power transistor 310, and n-MOS devices 370 and 372 are used as the second current mirrors for the n-MOS power transistor 314. The gates of the p-MOS devices 360 and 362 are connected to each other, and the drain of the p-MOS device 360 is connected to its gate and to the drain of the n-MOS device 342. Likewise, the gates of the n-MOS devices 370 and 372 are connected to each other, and the drain of the p-MOS device 370 is connected to its gate and to the drain of the p-MOS device 352. The drain of the p-MOS device 362 is connected to the gate of the p-MOS power transistor 310 and to the drain of n-MOS device 326, and the drain of the n-MOS device 372 is connected to the gate of the n-MOS power transistor 314 and the drain of p-MOS device 336.

Constant current sources 380 and 382, or "tail current" sources, provide the currents $I_{P1}$ and $I_{N1}$, to be mirrored through to the output gates of power transistors 310 and 314, respectively. The current source 380 is connected between the sources of the differential n-MOS pair 340 and 342 and the negative supply rail 308, and the constant current source 382 is connected between the sources of the differential p-MOS pair 350 and 352 and the positive supply rail 306. As such, one half of the current $I_{P1}$ is mirrored by the second current mirror devices 360 and 362 to the p-MOS power transistor 310, and one half of current $I_{N1}$ is mirrored by the second current mirror devices 370 and 372 to the n-MOS power transistor 314.

FIG. 3 shows a circuit schematic of an output stage 400 for a CMOS power amplifier featuring the improved bias network of the present invention. The bias network includes helper transistors 410 and 414, bias network transistors 452, 454, 462 and 464, and bias network resistors 430 and 440 as shown in FIG. 3. The bias network transistors and resistors allow the power transistors 310 and 314 to operate within sub-threshold regions of operation lying, at most, within a few hundred millivolts of their corresponding threshold voltages $V_t$, such that relatively small voltage swings are required to bias the power transistors 310 and 314 into corresponding saturation regions of operation. Operation of the power transistors 310 and 314 in such a manner greatly reduces the cross-over distortion of the output stage 400 at high frequencies as the gates of the power transistors 310 and 314 only have to swing, at most, a few hundred millivolts to turn on. In addition, the helper transistors 410 and 414, which are always operated in an "ON" state, are provided for dumping current into the output near the cross-over point.

Nominally, the helper transistors 410 and 414 are 100 to 1000 times smaller than the corresponding power amplifiers 310 and 314, i.e., the width-to-length ratio ("w/l") of the helper transistors 410 and 414 are 100 to 1000 times smaller than the w/l's of the corresponding power transistors 310 and 314. Preferably, the lengths of the power transistors and helper transistors are the same, with the power transistors being 100 to 1000 times wider than the helper transistors 410 and 414. The "larger" the transistor, the greater its maximum current handling and gain capabilities.

The bias network resistors 430 and 440 are designed to maintain the helper transistors 410 and 414 in "ON" states while maintaining the p-MOS and n-MOS power transistors 310 and 314 in "OFF" states. The values of 430 and 440 depend on (1) the type of amplifier being used, i.e., higher values for bias network resistors 430 and 440 for higher power amplifiers, (2) the magnitudes of reference currents $I_{P2}$ and $I_{N2}$, and (3) how the reference currents $I_{P2}$ and $I_{N2}$ are to be divided between the helper transistor 410 and p-MOS power transistor 310, and the helper transistor 414 and the n-MOS power transistor 314. Preferably, 430 is chosen such that helper transistor 410 is just turned on and the p-MOS power transistor 310 is just turned off, i.e., the current in the p-MOS power transistor 310 is less than or equal to the current in the helper transistor 410 by choosing the appropriate the value of the resistor 430. Likewise, 440 is chosen such that the helper transistor 414 is just turned on and the n-MOS power transistor 314 is just turned off, i.e., the current in the n-MOS power transistor 314 is less than or equal to the current in the helper transistor 414 by choosing the appropriate the value of the resistor 440. Nominal values for the resistors 430 and 440 range between 1 kΩ and 10 kΩ.

Preferably, the afore-mentioned resistance values are chosen to produce no more than a 100 to 200 mV drop across each of the resistors 430 and 440. As such, the power transistors 310 and 314 don't have to swing from zero volts, i.e., the negative supply rail 308, all the way to their threshold voltages $V_t$, which is typically 0.7 to 1.1V for a MOS device having a minimum gate length of one micron.

As further shown in FIG. 3, the "tail" current sources 380 and 382 are thus used to determine the values of resistors 430 and 440, respectively. For example, in order to produce a voltage drop of more than 200 mV across the resistor 430, as previously discussed, and assuming that transistor devices 360, 362, 370 and 372 have equal gains, the value for resistor 430 is chosen according to the relationship $R_{430}=200$ mV/$(0.5*I_{P1})$. Similarly, the value for resistor 440 is chosen according to the relationship $R_{440}=200$ mV/$(0.5*I_{N1})$. If the gains of the devices are different, then $R_{430}=200$ mV/$(0.5*w/l_{362}/w/l_{360})$ and $R_{440}=200$ mV/$(0.5*w/l_{372}/w/l_{370})$, where the "w/l's" are the width-to-length ratios of the corresponding p-MOS and n-MOS transistor devices 360, 362, 370 and 372.

Referring again to FIG. 3, a third current mirror for the p-MOS power transistor 310 is formed by a one transistor p-MOS amplifier 454 and the p-MOS helper transistor 410, and a third current mirror for the n-MOS power transistor 314 is formed by a one transistor n-MOS amplifier 464 and the n-MOS helper transistor 414. Bias network transistors 454 and 464, together with bias network transistors 452 and 462, also form the bias network feedback loops 450 and 460 for controlling the currents through 454 and 464, which should ideally equal the reference currents $I_{P2}$ and $I_{N2}$ produced by the current sources 470 and 480. Bias network transistor 452 is the output stage for the bias network that drives 320 and 322 and forces current into transistors 326 and 324, which turns on transistor 454 and 410. Bias network transistor 462 is the output stage of the bias network that drives 330 and 332 and which forces current into transistors 334 and 336 thus turning on transistors 464 and 414.

As previously described, the output stage 400 of FIG. 3 also includes complementary bias network feedback loops 450 and 460 comprised of the bias network transistors 452, 454, 462 and 464. The bias network feedback loop 450 corresponding to the p-MOS power transistor 310 starts at the drain of p-MOS bias network transistor 454, and includes p-MOS bias network transistor 452 and n-MOS current mirror transistor 326. Likewise, the complementary bias network feedback loop 460 for the p-MOS power transistor 314 starts at the drain of n-MOS bias network transistor 464, and includes n-MOS bias network transistor 462 and p-MOS current mirror transistor 336.

Via the feedback loops 450 and 460, bias network transistors 452 and 462 are turned "ON" as required to maintain the currents through 454 and 464 at precisely the reference currents $I_{P2}$ and $I_{N2}$ produced by the reference current sources 470 and 480. For the p-MOS power transistor 310, a summing junction is formed between 454 and the reference current source 470 such that the current through 454 equals the current $I_{P2}$ via the feedback loop 450. In other words, when the drain current through 454 is less than the reference current $I_{P2}$, reference current source 470 drives more current into 452, which in turn drives more current into 326. The increased current through 326 in turn "pulls" on the gate of 454, which causes the drain current of 454 to equal the reference current $I_{P2}$. When the drain current through 454 is greater than the reference current $I_{P2}$, less current is driven into 452, which in turn lowers the current into 326 causing the drain current of 454 to equal the reference current $I_{P2}$.

Similarly, for the n-MOS power transistor 314, a summing junction is formed between 464 and the current source 480 such that the current through 464 equals the current $I_{N2}$ via the bias network feedback loop 460. As such, the feedback loops 450 and 460 together with the resistors 430 and 440 are used to just keep the helper transistors 410 and 414 in "ON" states such that they are always ready to discharge current into the output near the cross-over point.

Although the present invention has been described in connection with particular embodiments thereof, it is to be understood that such embodiments are susceptible of modification and variation without departing from the inventive concept disclosed. All such modifications and variations, therefore, are intended to be included within the spirit and scope of the appended claims.

What is claimed is:

1. An improved bias network for minimizing cross-over distortion in a device having complementary p-MOS and n-MOS power transistors, said bias network comprising:
   complementary helper transistors coupled in parallel with said power transistors for discharging currents while said power transistors are biased in sub-threshold regions of operation;
   complementary resistors coupled to said power transistors for biasing said power transistors within said sub-threshold regions and for biasing said helper transistors within saturation regions of operation; and
   complementary feedback circuits connected to said power transistors and operating in conjunction with said resistors for biasing said helper transistors within said saturation regions.

2. The improved bias network according to claim 1, wherein each of said power transistors are biased into said saturation regions by gate voltage swings of no more than 200 millivolts from said sub-threshold regions.

3. The improved bias network according to claim 1, wherein said helper transistors are 100 to 1000 times smaller than said power transistors.

4. The improved bias network specified in claim 3, wherein each of said power transistors are biased into said saturation regions by gate voltage swings of no more than 200 millivolts from said sub-threshold regions.

5. The improved bias network specified in claim 3, wherein said helper transistors are 100 to 1000 times smaller than said power transistors.

6. In an audio amplifier having complementary p-MOS and n-MOS power transistors, an improved bias network for minimizing cross-over distortion comprising:

complementary helper transistors coupled in parallel with said power transistors for discharging currents while said power transistors are biased in sub-threshold regions of operation;

complementary resistors coupled to said power transistors for biasing said power transistors within said sub-threshold regions and for biasing said helper transistors within saturation regions of operation; and complementary feedback circuits connected to said power transistors and operating in conjunction with said resistors for biasing said helper transistors within said saturation regions.

* * * * *